(12) United States Patent
Okuno et al.

(10) Patent No.: US 7,940,112 B2
(45) Date of Patent: May 10, 2011

(54) SEMICONDUCTOR DEVICE

(75) Inventors: Shinya Okuno, Tokyo (JP); Kiyohiro Furutani, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/753,582

(22) Filed: Apr. 2, 2010

(65) Prior Publication Data

US 2010/0253317 A1  Oct. 7, 2010

(30) Foreign Application Priority Data

Apr. 6, 2009  (JP) .................................. 2009-092282

(51) Int. Cl.
*H01L 35/00* (2006.01)
*H03K 17/16* (2006.01)
*G11C 7/04* (2006.01)

(52) U.S. Cl. ........ 327/512; 327/513; 365/211; 365/226; 326/32; 326/95; 326/98

(58) Field of Classification Search ............ 326/32, 326/93, 95, 98; 327/512, 513, 534, 537, 327/539, 540; 365/211, 226–229
See application file for complete search history.

(56) References Cited

U.S. PATENT DOCUMENTS

| | | | | |
|---|---|---|---|---|
| 5,614,847 A * | 3/1997 | Kawahara et al. | ............... | 326/98 |
| 6,107,836 A * | 8/2000 | Kawahara et al. | ............. | 326/102 |
| 6,836,179 B2 * | 12/2004 | Mizuno et al. | ................ | 327/544 |
| 7,009,904 B2 * | 3/2006 | Kim | .............................. | 365/211 |
| 7,145,383 B2 * | 12/2006 | Mizuno et al. | ................ | 327/546 |
| 7,266,031 B2 * | 9/2007 | Kim et al. | ..................... | 365/211 |
| 7,286,432 B2 * | 10/2007 | Heilmann et al. | ............ | 365/211 |
| 7,345,931 B2 * | 3/2008 | Partsch et al. | ............ | 365/189.09 |
| 7,352,236 B2 * | 4/2008 | Mizuno | ......................... | 327/544 |
| 7,639,068 B2 * | 12/2009 | Mizuno et al. | ................ | 327/541 |
| 7,830,204 B2 * | 11/2010 | Mizuno | ......................... | 327/544 |

FOREIGN PATENT DOCUMENTS

JP  2000-195254  7/2000

* cited by examiner

*Primary Examiner* — Vibol Tan
(74) *Attorney, Agent, or Firm* — Morrison & Foerster LLP (57) ABSTRACT

To include a first X decoder constituted by a transistor whose off-leakage current has a first temperature characteristic, a pre-decoder circuit and a peripheral circuit constituted by a transistor whose off-leakage current has a second temperature characteristic, a power supply control circuit that inactivates the X decoder when a temperature exceeds a first threshold during a standby state, and a power supply control circuit that inactivates the pre-decoder and the peripheral circuit when a temperature exceeds a second threshold during the standby state. According to the present invention, whether power supply control is performed on a plurality of circuit blocks is determined based on different temperatures, therefore optimum power supply control can be performed on each of circuit blocks.

20 Claims, 7 Drawing Sheets

SEMICONDUCTOR DEVICE

BACKGROUND OF THE INVENTION

1. Field of the Invention

The present invention relates to a semiconductor device, and more particularly relates to a semiconductor device capable of reducing an off-leakage current of a transistor.

2. Description of Related Art

Demands for power consumption reduction of semiconductor devices have been increased in recent years. One of techniques for reducing power consumption of semiconductor devices is a power supply hierarchization technique. The power supply hierarchization technique is a technique in which a power supply wiring for supplying power to a circuit block is hierarchized into a main power supply wiring and a sub power supply wiring, thereby reducing an off-leakage current (a sub-threshold current) during a standby state (see Japanese Patent Application Laid-open No. 2000-195254).

Specifically, the main power supply wiring and the sub power supply wiring are short-circuited in an active state, thereby supplying power to these power supply wirings. An operating voltage is thus supplied correctly to corresponding circuit blocks. Meanwhile, during a standby state, the main power supply wiring and the sub power supply wiring are disconnected from each other, thereby blocking the power supply to the sub power supply wiring. With this arrangement, power supply to transistors that are irrelevant to maintaining a predetermined fixed logic is stopped. In this way, an off-leakage current of a circuit block whose logic is fixed during a standby state, such as a main word driver of a DRAM (Dynamic Random Access Memory), can be reduced.

Japanese Patent Application Laid-open No. 2000-195254 only discloses a technique of determining whether a power supply of a main power supply wiring is supplied to a sub power supply wiring in a standby state and an active state of a semiconductor device. However, in view of the entire power consumption of a semiconductor device during a standby state, an off-leakage current of a transistor that constitutes a circuit block is a static current and its power consumption varies depending on temperature. Meanwhile, a switching current of a power-supply control transistor that connects a main power supply wiring to a sub power supply wiring is a dynamic current and its power consumption hardly varies depending on temperature. For example, according to an MOS transistor, which is a representative transistor, its off-leakage current is reduced as the temperature decreases. Besides, the switching current of a power-supply control transistor has a low temperature dependency because a current generated by charging/discharging a gate capacity of the power-supply control transistor is dominant. When a chip temperature is lower than a predetermined temperature, power consumption by a charge and discharge current in a signal line that drives the power-supply control transistor becomes larger than that by an off-leakage current. In such a temperature region, the entire power consumption of the semiconductor device during the standby state is reduced if the power-supply control transistor is always turned on (conductive) to activate a circuit constituted by a transistor.

The temperature of a semiconductor device changes rapidly depending on an operating state of the semiconductor device itself or an adjacent semiconductor device. When the semiconductor device is a memory, in a case of refreshing memory cells at a predetermined period for maintaining information about the memory cells, successive accesses are made in a state before the refresh operation and thus the temperature (silicon substrate's temperature) can be increased, or the state before the refresh operation is maintained in a standby state and thus the temperature can be maintained low. Heat from other silicon chips can be shared by a MCP or the like. That it, the value of an off-leakage current generated in a circuit block always changes depending on continuously varying temperature.

In recent years, the operating voltage of a semiconductor device has been gradually reduced for power consumption reduction. A significantly low voltage, such as around 1.0V of an external supply voltage, has been used recently and an internal supply voltage to be supplied to a circuit block has been also further reduced correspondingly. When the operating voltage of the circuit block is reduced, the threshold voltage of a transistor needs to be further reduced to maintain the operating voltage of the circuit block. Therefore, there is a problem that the off-leakage current of a transistor in a non-conductive state is further increased.

Besides, semiconductor devices usually include an internal supply voltage (positive or negative boost internal voltage) generated within the semiconductor devices regardless of a decrease in an external supply voltage. A circuit block to which the internal supply voltage is supplied also has the above described problems about the off-leakage current and the power-supply control transistor.

In view of such circumstances, even various circuit blocks, with which an off-leakage current during a standby state had not been problematic before, need to apply the power supply hierarchization technique.

However, the temperature characteristic of an off-leakage current of a transistor can be different for each circuit block. In this case, a threshold temperature at which the charge and discharge current of a power-supply control transistor is larger than the off-leakage current thereof is also different for each circuit block. Therefore, when a threshold temperature for stopping power supply control is set for a plurality of circuit blocks (set uniformly), the power consumption of the entire semiconductor device cannot be reduced sufficiently.

SUMMARY

In one embodiment, there is provided a semiconductor device that includes: a first circuit block constituted by a transistor whose off-leakage current has a first temperature characteristic; a second circuit block constituted by a transistor whose off-leakage current has a second temperature characteristic, which is different from the first temperature characteristic; a first power supply control circuit that inactivates a power supply of the first circuit block when a temperature exceeds a first threshold temperature during a standby state; and a second power supply control circuit that inactivates a power supply of the second circuit block when a temperature exceeds a second threshold temperature, which is different from the first threshold temperature during the standby state.

"Exceeding a threshold temperature" means any one of cases that a chip temperature is higher than a threshold temperature and that a chip temperature is lower than a threshold temperature. Specifically, in a transistor that an off-leakage current is reduced as its temperature decreases like a MOS transistor, "exceeding a threshold temperature" corresponds to the case that a chip temperature is lower than a threshold temperature. On the other hand, in a transistor that an off-leakage current is reduced as its temperature increases, "exceeding a threshold temperature" corresponds to the case that a chip temperature is higher than a threshold temperature.

According to the present invention, "activation" of a circuit block means a state that an output signal from the corresponding circuit block can be changed depending on an input signal. That is, in a case that the corresponding circuit block is activated, the output signal is activated when a predetermined combination of input signals is supplied, and the output signal is inactivate when another combination of input signals different from the predetermined combination is supplied. On the other hand, "inactivation" means a state that an output signal from the corresponding circuit block is fixed regardless of an input signal. That is, when the corresponding circuit block is inactivated, the output signal is not activated even when a predetermined combination of input signals is inputted. Of course, the output signal is not activated even when another combination of input signals different from the predetermined combination is supplied.

According to the present invention, whether power supply control is performed on a plurality of circuit blocks is determined based on different temperatures. Therefore, optimum power supply control can be performed on each circuit block.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A representative example of the technical concept for solving the problems of the present invention is described below. However, the scope of the present application is not limited to the technical concept and only limited to the contents of the descriptions in the claims of the present application.

The present invention is focused on a fact that there is a case that a threshold temperature at which a charge and discharge current of a power-supply control transistor is larger than an off-leakage current is different for each of circuit blocks, and the invention has a technical concept of setting a threshold temperature for stopping power supply control for each of the circuit blocks.

Taking this characteristic into consideration, a semiconductor device that utilizes the power supply hierarchization technique adopts a method of individually controlling (activating/inactivating) power supply control on corresponding circuit blocks when a chip temperature is equal to or lower predetermined threshold temperatures (that are different from each other). When the power supply control is stopped (inactivated), a power-supply control transistor in a circuit block is always turned on (conductive) even in a standby state. Accordingly, power consumption by a power supply control circuit itself caused by switching the power-supply control transistor does not occur.

A preferred embodiment of the present invention will be explained below in detail with reference to the drawings.

Figure 1:
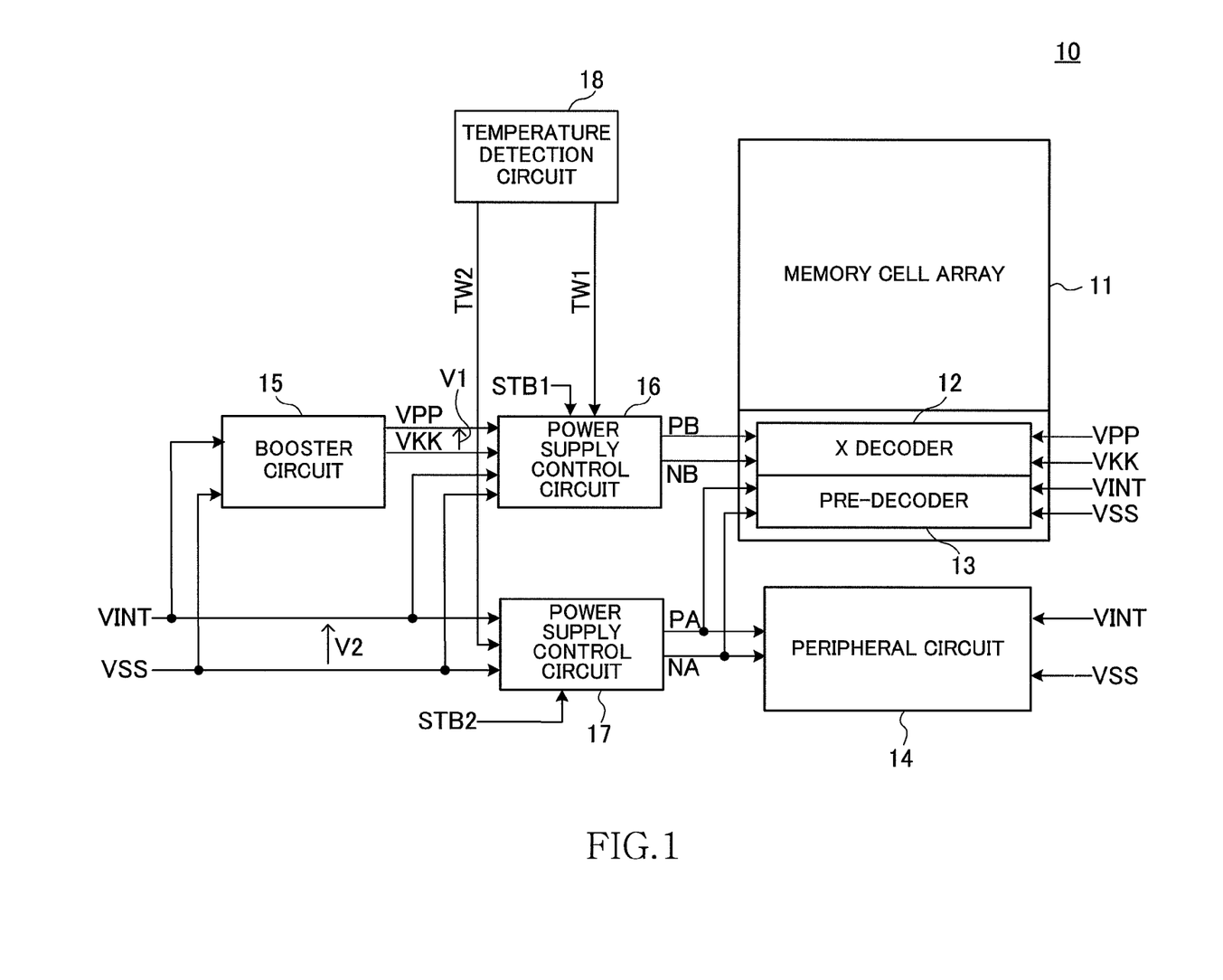
FIG. 1 is a block diagram showing a configuration of a semiconductor device 10 according to the embodiment.

FIG. 1 is a block diagram showing a configuration of a semiconductor device 10 according to the embodiment.

The semiconductor device 10 according to the present embodiment is a semiconductor memory such as a DRAM, and includes a memory cell array 11 that includes a plurality of memory cells, an X decoder 12 for accessing the memory cell array 11 in a row direction, a pre-decoder 13 that supplies address signals to the X decoder 12, and a peripheral circuit 14 that includes a Y decoder for accessing the memory cell array in a column direction and a data input/output circuit that controls read data and write data.

The memory cell array 11 is a region where a large number of memory cells such as DRAM cells are arranged in a matrix. As widely known, the DRAM cell is constituted by a cell transistor and a cell capacitor, and any of the DRAM cells can be selected by activating a corresponding word line. According to typical DRAMs, a word line has a hierarchical structure constituted by a main word line and a sub-word line. The X decoder 12 is a circuit block for driving the main word line. The sub-word line is selected by a sub-word driver (not shown) included in the memory cell array 11.

As shown in FIG. 1, the semiconductor device 10 according to the present embodiment further includes a booster circuit 15, power supply control circuits 16 and 17, and a temperature detection circuit 18.

The booster circuit 15 receives an internal supply voltage V2 that a higher potential is indicated by VINT and a lower potential is indicated by VSS and boosts it to generate a boost supply voltage V1 that the higher potential is indicated by VPP and the lower potential is indicated by VKK. VPP is a positive boost voltage and VKK is a negative boost voltage. While specific values of these potentials are not limited particularly, VINT=1.2 V, VSS=0 V, VPP=2.7 V, and VKK=−0.3 V, for example. In such a case, the internal supply voltage V2 is 1.2 V (=1.2 V−0 V) and the boost supply voltage V1 is 3.0 V (=2.7 V+0.3 V). The internal supply voltage V2 can be an external voltage or a voltage obtained by reducing the external voltage.

The potentials VPP and VKK defining the boost supply voltage V1 are supplied to the X decoder 12. The potentials VINT and VSS defining the internal supply voltage V2 are supplied to the pre-decoder 13 and the peripheral circuit 14. Accordingly, the boost supply voltage V1 is used as an operating voltage for the X decoder 12 and the internal supply voltage V2 is used as an operating voltage for the pre-decoder 13 and the peripheral circuit 14. The boost supply voltage V1 is used for the X decoder 12 because the word line needs to be swung to the internal supply voltage V2 or higher in a DRAM. Specific circuit configurations of the X decoder 12 or the like will be described later.

The potentials VPP and VKK defining the boost supply voltage V1 are supplied to the power supply control circuit 16 as well as the X decoder 12. The potentials VINT and VSS defining the internal supply voltage V2 are supplied to the power supply control circuits 16 and 17 as well as the pre-decoder 13 and the peripheral circuit 14.

The power supply control circuits 16 and 17 are described next.

The power supply control circuit 16 generates power supply control signals PB and NB and the generated power supply control signals PB and NB are supplied to the X decoder 12. The power supply control signals PB and NB are for switching between activation and inactivation of the X decoder 12 and the switching is determined by a standby signal STB1 and a temperature detection signal TW1. Specifically, when the standby signal STB1 indicates a standby state and the temperature detection signal TW1 is activated, the power supply control signals PB and NB are at an inactivation level, so that the X decoder 12 is inactivated (in a non-conductive state that a power supply is not provided to a circuit). In other cases, the power supply control signals PB and NB are at an activation level, so that the X decoder 12 is activated (in a conductive state that a power supply is supplied to a circuit). Activation levels of the power supply control signals PB and NB are VSS (0 V) and VINT (1.2 V), and their inactivation levels are VPP (2.7 V) and VKK (−0.3 V) in the present embodiment.

The standby signal STB1 indicates whether the X decoder 12 is in an active state or in a standby state. Meanwhile, the temperature detection signal TW1 is supplied from the temperature detection circuit 18 and activated when a chip temperature exceeds a first threshold TMP1. According to the present embodiment, the first threshold TMP1 is set to 70° C. and the temperature detection signal TW1 is activated when the chip temperature exceeds 70° C. Accordingly, when the standby signal STB1 indicates the standby state and the chip temperature exceeds 70° C., the X decoder 12 is inactivated.

The power supply control circuit 17 generates power supply control signals PA and NA and the generated power supply control signals PA and NA are supplied to the pre-decoder 13 and the peripheral circuit 14. The power supply control signals PA and NA are for switching between activation and inactivation of the pre-decoder 13 and the peripheral circuit 14. The switching is determined by a standby signal STB2 and a temperature detection signal TW2. Specifically, when the standby signal STB2 indicates a standby state and the temperature detection signal TW2 is activated, the power supply control signals PA and NA are at an inactivation level, so that the pre-decoder 13 and the peripheral circuit 14 are inactivated. In other cases, the power supply control signals PA and NA are at an activation level, so that the pre-decoder 13 and the peripheral circuit 14 are activated. In the present embodiment, the activation levels of the power supply control signals PA and NA are VSS (0 V) and VINT (1.2 V) and their inactivation levels are VINT (1.2 V) and VSS (0 V).

The standby signal STB2 indicates whether the pre-decoder 13 and the peripheral circuit 14 are in an active state or in a standby state. Meanwhile, the temperature detection signal TW2 is supplied from the temperature detection circuit 18 and activated when the chip temperature exceeds a second threshold TMP2 (<TMP1). The second threshold TMP2 is set to 25° C. in the present embodiment and when the chip temperature exceeds 25° C., the temperature detection signal TW2 is activated. Accordingly, when the standby signal STB2 indicates the standby state and the chip temperature exceeds 25° C., the pre-decoder 13 and the peripheral circuit 14 are inactivated.

The standby signal STB1 and the standby signal STB2 can be the same. These standby signals STB1 and STB2 can be internal signals generated in the semiconductor device 10 or external signals supplied from externals of the semiconductor device 10. Similarly, the temperature detection signals TW1 and TW2 can be internal signals generated in the semiconductor device 10 or external signals supplied from the externals of the semiconductor device 10. When the temperature detection signals TW1 and TW2 are external signals, the temperature detection circuit 18 is provided outside the semiconductor device 10.

Figure 2:
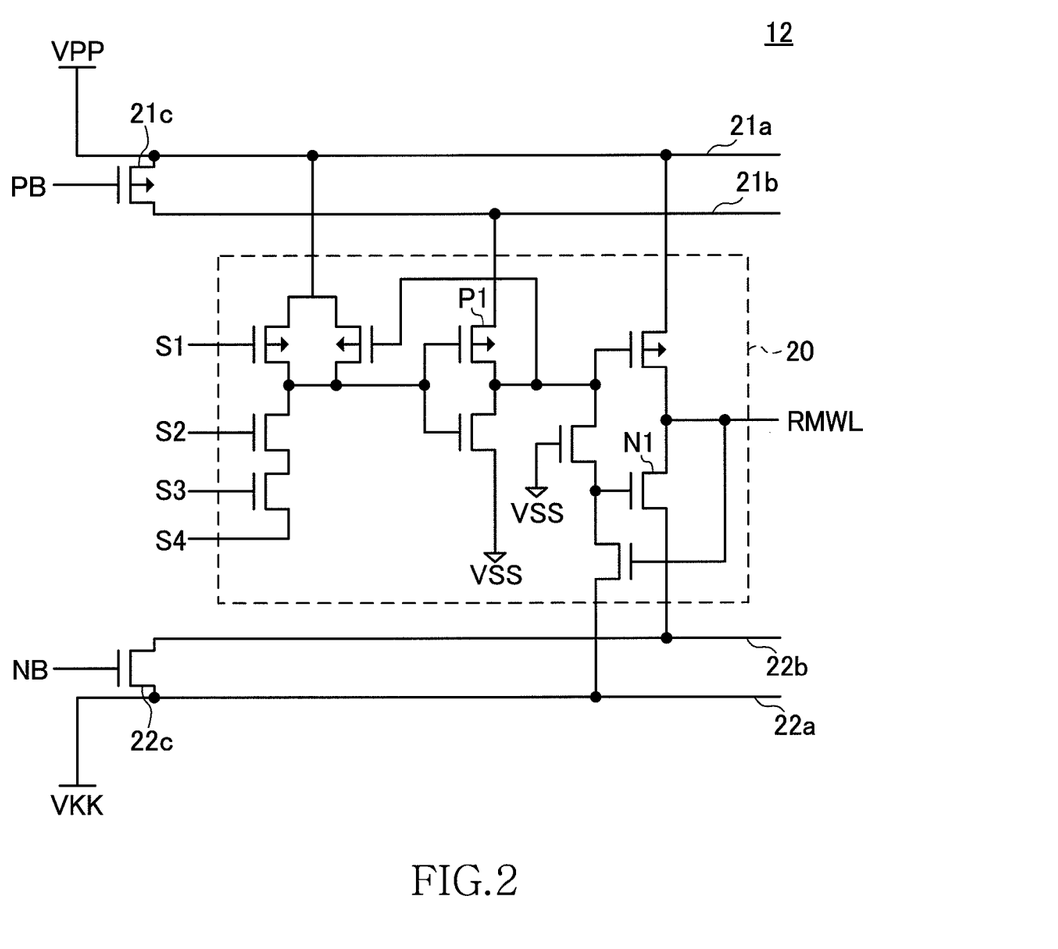
FIG. 2 is a circuit diagram of a unit decoder 20 included in the X decoder 12.

FIG. 2 is a circuit diagram of a unit decoder 20 included in the X decoder 12. The unit decoder 20 is a logic circuit for selecting one main word line RMWL. The X decoder 12 is thus provided with a certain number of the unit decoders 20 shown in FIG. 2, which number is the same as the number of main word lines. The unit decoder 20 is configured by special transistors (that are different from general transistors to be described later). In the present application, the special transistor is different from the general transistor in at least temperature characteristics of an off-leakage current. Examples of differences in temperature characteristics of an off-leakage current can include differences in voltage to be supplied to transistors, in channel width/channel length of transistors, in film thickness under gate electrodes, and in configurations of transistors.

As shown in FIG. 2, a power supply of the unit decoder 20 is hierarchized. Specifically, main power supply wirings 21a and 22a that the potentials VPP and VKK defining the boost supply voltage V1 are supplied to, respectively, sub power supply wirings 21b and 22b corresponding to the respective main power supply wirings 21a and 22a, a power-supply control transistor 21c connected between the main power supply wiring 21a and the sub power supply wiring 21b, and a power-supply control transistor 22c connected between the main power supply wiring 22a and the sub power supply wiring 22b are provided. Higher power supply nodes of the transistors included in the unit decoder 20 (sources of P-channel MOS transistors) are connected to one of the main power supply wiring 21a and the sub power supply wiring 21b. Lower power supply nodes of the transistors included in the unit decoder 20 (sources of N-channel MOS transistors) are connected to one of the main power supply wiring 22a and the sub power supply wiring 22b.

The power-supply control transistor 21c is a P-channel MOS transistor and the power supply control signal PB is supplied to its gate. As described above, the activation level of the power supply control signal PB is VSS (0 V). Accordingly, when the power supply control signal PB is activated, the main power supply wiring 21a and the sub power supply wiring 21b are short-circuited (conducted). The level of the main power supply wiring 21a and the sub power supply wiring 21b thus becomes VPP (2.7 V). The inactivation level of the power supply control signal PB is VPP (2.7 V). When the power supply control signal PB is inactivated, the main power supply wiring 21a and the sub power supply wiring 21b are disconnected from each other (become non-conductive). While the level of the main power supply wiring 21a is maintained at VPP (2.7 V), only an off-leakage current of the power-supply control transistor 21c is supplied to the sub power supply wiring 21b. Therefore, the level of the sub power supply wiring 21b becomes about 2.2 V.

Meanwhile, the power-supply control transistor 22c is an N-channel MOS transistor and the power supply control signal NB is supplied to its gate. As described above, the activation level of the power supply control signal NB is VINT (1.2 V). When the power supply control signal NB is activated, the main power supply wiring 22a and the sub power supply wiring 22b are short-circuited (conducted). The level of the main power supply wiring 22a and the sub power supply wiring 22b thus becomes VKK (−0.3 V). The inactivation level of the power supply control signal NB is VKK (−0.3 V). When the power supply control signal NB is inactivated, the main power supply wiring 22a and the sub power supply wiring 22b are disconnected from each other (become non-conductive). With this configuration, while the level of the main power supply wiring 22a is maintained at VKK (−0.3 V), power supply to the sub power supply wiring 22b is only an off-leakage current of the power-supply control transistor 22c. Therefore, the level of the sub power supply wiring 22b becomes about 0.3 V.

Such a configuration allows power to be supplied correctly to all transistors that constitute the unit decoder 20 when the power supply control signals PB and NB are at an activation level. When pre-decode signals S1 to S4 are in a predetermined combination, the unit decoder 20 drives the corresponding main word line RMWL to be at the activation level (VKK). When the pre-decode signals S1 to S4 are in a combination different from the predetermined combination, the unit decoder 20 fixes the corresponding main word line RMWL at the inactivation level (VPP). According to the example shown in FIG. 2, the predetermined combination indicates a state that the pre-decode signals S1 to S3 are at a high level and the pre-decode signal S4 is at a low level. The pre-decode signals S1 to S4 are supplied from the pre-decoder 13 shown in FIG. 1.

On the other hand, when the power supply control signals PB and NB are at the inactivation level, the sub power supply wirings 21b and 22b are disconnected from the main power supply wirings 21a and 22a, respectively. Accordingly, a potential is not supplied to transistors P1 and N1 that constitute the unit decoder 20. However, the potential does not need to be supplied to these transistors P1 and N1 for fixing the corresponding main word line RMWL at the inactivation level (VPP). Even if the power-supply control transistors 21c and 22c are turned off and thus a potential is not supplied to the transistors P1 and N1, the main word line RMWL is fixed at the inactivation level (VPP) correctly. The potential is not supplied to the transistors P1 and N1 and thus the off-leakage current of a transistor that constitutes the unit decoder 20 is reduced. Accordingly, power consumption during a standby state is reduced.

Because the unit decoder 20 shown in FIG. 2 uses the boost supply voltage V1 as a power supply, the threshold voltage of the transistors that constitute the unit decoder is set to be relatively higher than that of a normal transistor without using a boost supply voltage. Therefore, the off-leakage current per unit W/L (channel width/channel length) of the transistors that constitute the unit decoder 20 is less than that of the normal transistor with relatively low threshold voltage. The unit W/L ratio means a predetermined ratio obtained when the channel width of a transistor is indicated by W and the channel length thereof is indicated by L. In the unit decoder 20, thicknesses of gate films of the transistors are set to be relatively thick so that a sufficient gate breakdown voltage is ensured.

Figure 3:
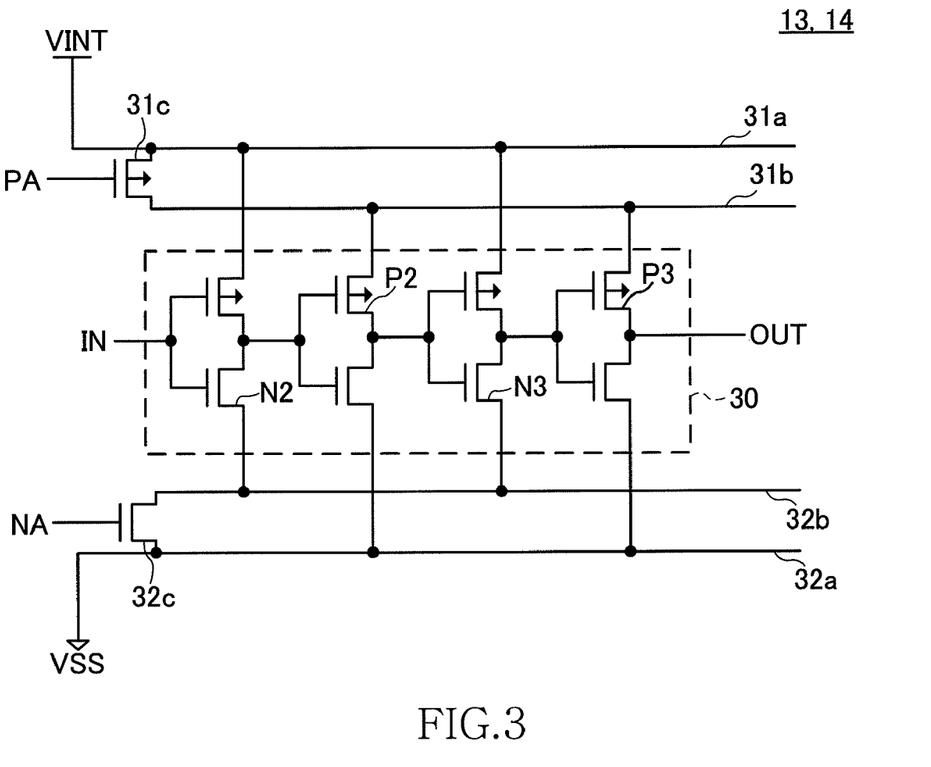
FIG. 3 is a circuit diagram of a logic circuit 30 included in the pre-decoder 13 and the peripheral circuit 14.

FIG. 3 is a circuit diagram of a logic circuit 30 included in the pre-decoder 13 and the peripheral circuit 14. Of course, the pre-decoder 13 and the peripheral circuit 14 are constituted by a large number of the logic circuits 30, and the logic circuit 30 shown in FIG. 3 is a part of them. The pre-decoder 13 and the peripheral circuit 14 are constituted by the above normal transistors.

The logic circuit 30 shown in FIG. 3 is a so-called inverter chain and its power supply is hierarchized. Specifically, main power supply wirings 31a and 32a that the potentials VINT and VSS defining the internal supply voltage V2 are supplied to, respectively, sub power supply wirings 31b and 32b corresponding to the respective main power supply wirings 31a and 32a, a power-supply control transistor 31c connected between the main power supply wiring 31a and the sub power supply wiring 31b, and a power-supply control transistor 32c connected between the main power supply wiring 32a and the sub power supply wiring 32b are provided. Higher power supply nodes of transistors included in the logic circuit 30 (sources of P-channel MOS transistors) are connected to one of the main power supply wiring 31a and the sub power supply wiring 31b. Lower power supply nodes of the transistors included in the logic circuit 30 (sources of N-channel MOS transistors) are connected to one of the main power supply wiring 32a and the sub power supply wiring 32b.

The power-supply control transistor 31c is a P-channel MOS transistor and the power supply control signal PA is supplied to its gate. As described above, the activation level of the power supply control signal PA is VSS (0 V). When the power supply control signal PA is activated, the main power supply wiring 31a and the sub power supply wiring 31b are short-circuited. Therefore, the level of the main power supply wiring 31a and the sub power supply wiring 31b becomes VINT (1.2 V). The inactivation level of the power supply control signal PA is VINT (1.2 V). When the power supply control signal PA is inactivated, the main power supply wiring 31a and the sub power supply wiring 31b are disconnected from each other. While the level of the main power supply wiring 31a is maintained at VINT (1.2 V), power supply to the sub power supply wiring 31b is only the off-leakage current of the power-supply control transistor 31c. Therefore, the level of the sub power supply wiring 31b becomes about 0.9 V.

Meanwhile, the power-supply control transistor 32c is an N-channel MOS transistor and the power supply control signal NA is supplied to its gate. As described above, the activation level of the power supply control signal NA is VINT (1.2 V). Accordingly, when the power supply control signal NA is activated, the main power supply wiring 32a and the sub power supply wiring 32b are short-circuited. Therefore, the level of the main power supply wiring 32a and the sub power supply wiring 32b becomes VSS (0 V). The inactivation level of the power supply control signal NA is VSS (0 V). When the power supply control signal NA is inactivated, the main power supply wiring 32a and the sub power supply wiring 32b are disconnected from each other. While the level of the main power supply wiring 32a is maintained at VSS (0 V), power supply to the sub power supply wiring 32b is only the off-leakage current of the power-supply control transistor 32c. Therefore, the level of the sub power supply wiring 32b becomes about 0.34 V.

With such a configuration, when the power supply control signals PA and NA are at the activation level, a potential is supplied correctly to all transistors that constitute the logic circuit 30. Accordingly, the logical level of an output signal OUT varies correctly depending on the logical level of an input signal IN. The input signal IN is a signal whose logical level is a low level during a standby state. Therefore, the logical level of the output signal OUT is a low level during the standby state.

On the other hand, when the power supply control signals PA and NA are at the inactivation level, the sub power supply wirings 31b and 32b are disconnected from the main power supply wirings 31a and 32a, respectively. Accordingly, a potential is not supplied to some transistors P2, P3, N2 and N3 that constitute the logic circuit 30. However, the potential does not need to be supplied to these transistors P2, P3, N2 and N3 to fix the output signal OUT to a low level (VSS). Even if a potential is not supplied to the transistors P2, P3, N2 and N3 because the power-supply control transistors 31c and 32c are turned off, the output signal OUT is fixed correctly to the inactivation level (VSS). Because the potential is not supplied to the transistors P2, P3, N2 and N3, the off-leakage current of transistors that constitute the logic circuit 30 is reduced. Accordingly, power consumption during a standby state is reduced.

Because the logic circuit 30 shown in FIG. 3 uses the internal supply voltage V2 as its power supply, the threshold voltage is set to be relatively low. Accordingly, the off-leakage current per unit W/L ratio of the transistors that constitute the logic circuit 30 is larger than that of a transistor with a relatively high threshold voltage, like the transistor that constitutes the unit decoder 20 shown in FIG. 2. Because the boost supply voltage V1 is not used in the logic circuit 30, thicknesses of gate films of the transistors are set to be relatively thin.

Figure 4:
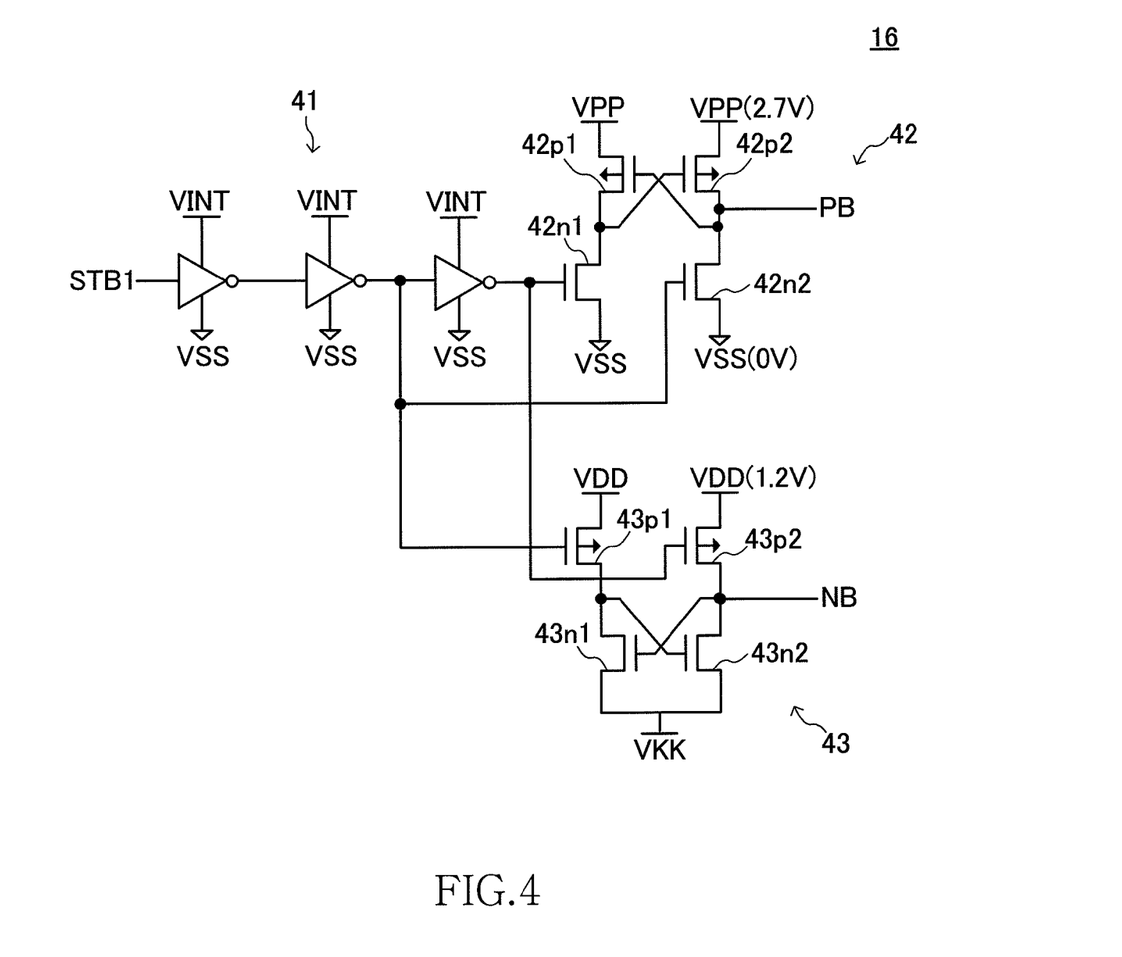
FIG. 4 is a circuit diagram of the power supply control circuit 16.

FIG. 4 is a circuit diagram of the power supply control circuit 16.

As shown in FIG. 4, the power supply control circuit 16 includes an inverter chain 41 that generates internal signals whose phases are the same as and reverse to that of the standby signal STB1 and level converting circuits 42 and 43 that generate the power supply control signals PB and NB based on the internal signals.

The level converting circuit 42 is constituted by P-channel MOS transistors 42p1 and 42p2 cross-coupled between the potential VPP and the potential VSS and N-channel MOS transistors 42n1 and 42n2 connected serially to the transistors 42p1 and 42p2, respectively. One of the transistors 42n1 and 42n2 is turned on and the other is turned off depending on the logical level of the standby signal STB1. Therefore, the level of the generated power supply control signal PB is VPP or VSS.

Similarly, the level converting circuit 43 is constituted by N-channel MOS transistors 43n1 and 43n2 cross-coupled between the potential VINT and the potential VKK and P-channel MOS transistors 43p1 and 43p2 connected serially to the transistors 43n1 and 43n2, respectively. One of the transistors 43p1 and 43p2 is turned on (conductive) and the other is turned off (non-conductive) depending on the logical level of the standby signal STB1. Therefore, the level of the generated power supply control signal NB is VINT or VKK.

Figure 5:
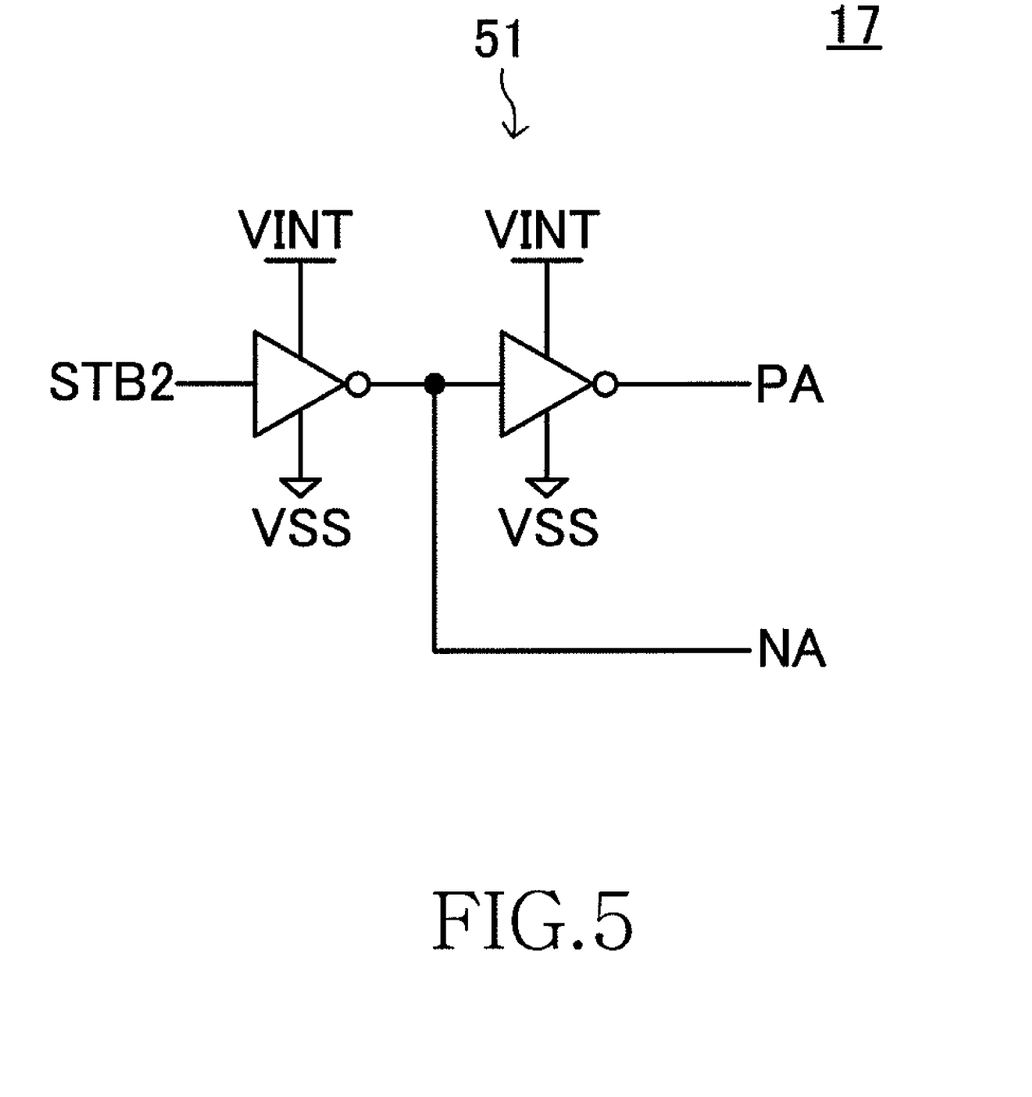
FIG. 5 is a circuit diagram of the power supply control circuit 17.

FIG. 5 is a circuit diagram of the power supply control circuit 17.

As shown in FIG. 5, the power supply control circuit 17 is constituted by an inverter chain 51 that generates internal signals whose phases are the same as and reverse to that of the standby signal STB2. The inverter chain 51 uses the voltage between the potential VINT and the potential VSS, that is, the internal supply voltage V2 as the operating voltage. The level of the power supply control signal PA is one of VINT and VSS and the level of the power supply control signal NA is the other depending on the logical level of the standby signal STB2.

The configuration of the semiconductor device 10 according to the present embodiment is as described above. An operation of the semiconductor device 10 depending on a chip temperature is described next.

Figure 6:
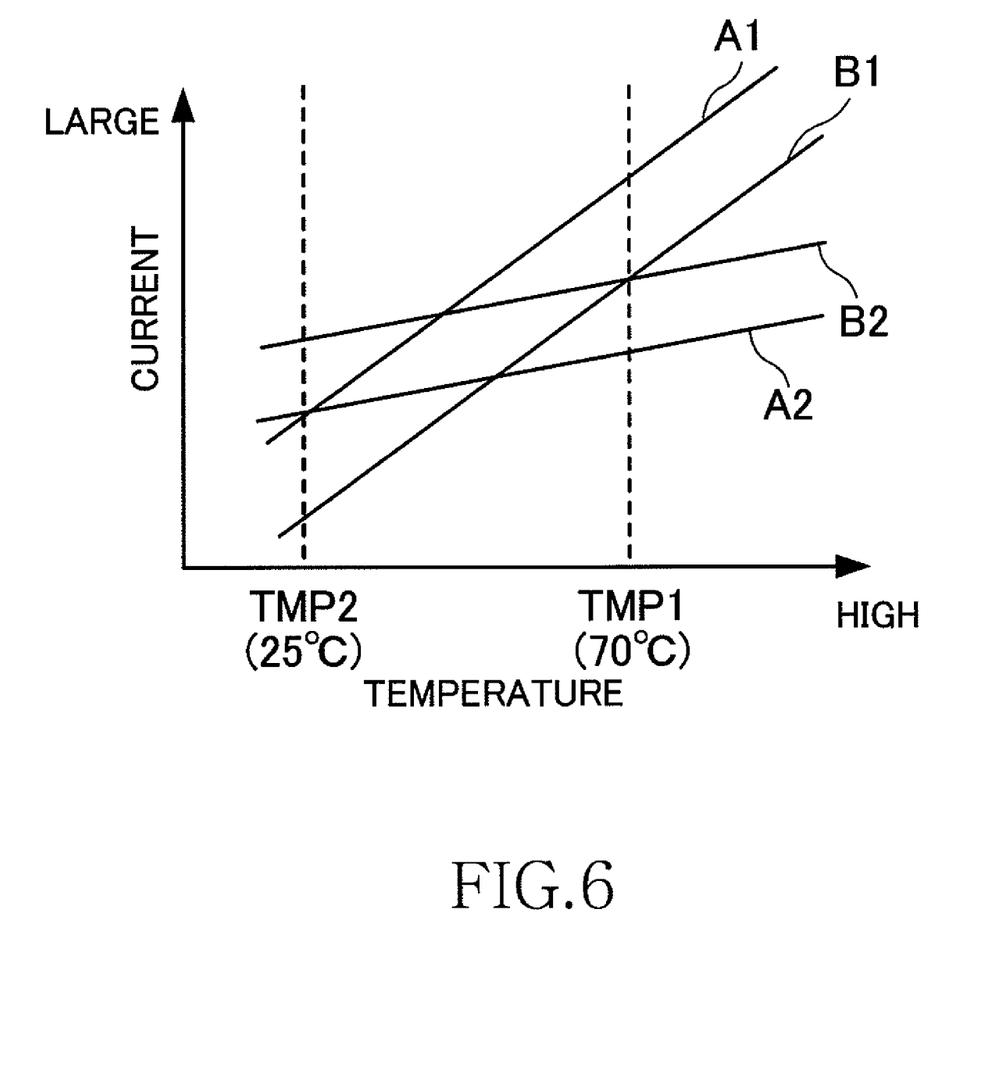
FIG. 6 is a graph showing temperature characteristics of an off-leakage current.

FIG. 6 is a graph showing temperature characteristics of an off-leakage current.

A line A1 shown in FIG. 6 indicates temperature characteristics of an off-leakage current of the pre-decoder 13 and the peripheral circuit 14. A line B1 shown in FIG. 6 indicates temperature characteristics of an off-leakage current of the X decoder 12. As shown by the lines A1 and B1, the off-leakage currents (static currents) of these circuit blocks are increased as temperature is increased. At a same temperature, the off-leakage current of the pre-decoder 13 and the peripheral circuit 14 is larger than that of the X decoder 12. A current value of the line A1 is larger than that of the line B1 because threshold voltages of thin film transistors in the line A1 are relatively low.

A line A2 shown in FIG. 6 indicates the switching current of the power-supply control transistors 31c and 32c shown in FIG. 3. A line B2 shown in FIG. 6 indicates the switching current of the power-supply control transistors 21c and 22c shown in FIG. 2. As shown by the lines A2 and B2, the temperature dependency of switching currents of the transistors is lower than that of the lines A1 and B1. This is because the switching current of a power-supply control transistor is mainly due to the charge and discharge current (dynamic current) of gate capacity of the power-supply control transistor. The switching current of the power-supply control transistors 21c and 22c shown by the line B2 is larger than that of the power-supply control transistors 31c and 32c shown by the line A2. This is because while the pre-decoder 13 and the peripheral circuit 14 use the internal supply voltage V2 which has not been increased as the operating voltage, the X decoder 12 uses the boost supply voltage V1 as the operating voltage.

The temperature dependency of the lines A2 and B2 is decreased as the temperature is decreased. This is because a refresh period (an internal period) of memory cells is extended by an internal timer incorporated in a semiconductor device. To handle characteristics that the time that memory cells requiring updates of stored information hold information is long at a low temperature, the internal period of the refresh operation is extended in a self refresh mode, so that the number of refresh operations during a predetermined period of time is decreased. The period of the refresh operation performed independently within the semiconductor device even in its standby state is an active period like a period that the semiconductor device is externally accessed. During the refresh interval, at least power-supply control transistors required for the refresh operation are all activated every refresh operation. The charge and discharge current of the power-supply control transistor is thus generated, which becomes a consumption current.

It is most preferable that power supply controls of peripheral circuits (for example, a column circuit and an I/O circuit) unrelated to the refresh operation remain inactivated. By making a power-supply control transistor connecting the power supply to the sub power supply of the peripheral circuit unrelated to the refresh operation always inactivated (non-conductive), the current values of the lines A2 and B2 are further reduced. Examples of the column circuit and the I/O circuit include a Y decoder and a Y pre-decoder that relate to a memory cell array (not shown), a read/write amplifier (not shown), an input/output circuit that relates to input/output terminals of a semiconductor device, and a phase lock loop that relates to DLL and PLL. In some cases, the input/output circuit is constituted by thick film transistors. In non-volatile memories or the like, the Y-decoder is also constituted by thick film transistors.

When the internal period is not changed, the temperature dependencies of the lines A2 and B2 become flat.

The line A1 crosses the line A2 at a temperature TMP2. This means that a region where the temperature is higher than TMP2 is a temperature region that the off-leakage current of the pre-decoder 13 and the peripheral circuit 14 is larger than the switching current of the power-supply control transistors 31c and 32c and in this case, power consumption is reduced when power supply control is performed by the power supply control circuit 17. This also means that a region where the temperature is lower than TMP2 is a temperature region that the off-leakage current of the pre-decoder 13 and the peripheral circuit 14 is smaller than the switching current of the power-supply control transistors 31c and 32c and in this case, power consumption is increased when the power supply control is performed by the power supply control circuit 17. The temperature TMP2 corresponds to the above second threshold TMP2 and is specifically set to 25° C.

Similarly, the line B1 crosses the line B2 at a temperature TMP1. This means that a region where the temperature is higher than TMP1 is a temperature region that the off-leakage current of the X decoder 12 is larger than the switching current of the power-supply control transistors 21c and 22c and in this case, power consumption is decreased when the power supply control by the power supply control circuit 16 is performed. This also means that a region where the temperature is lower than TMP1 is a temperature region that the off-leakage current of the X decoder 12 is smaller than the switching current of the power-supply control transistors 21c and 22c and in this case, power consumption is increased when the power supply control is performed by the power supply control circuit 16. The temperature TMP1 corresponds to the above first threshold TMP1 and is set specifically to 70° C.

Taking the above points into consideration, when the chip temperature exceeds TMP1 (=70° C.), the power supply control is performed on the X decoder 12 by the power supply control circuit 16 in response to the standby signal STB1 in the present embodiment. In the case that the chip temperature exceeds TMP1 (=70° C.), when the standby signal STB1 indicates a standby state, the power-supply control transistors 21c and 22c are turned off to reduce the off-leakage current and when the standby signal STB1 indicates an active state, the power-supply control transistors 21c and 22c are turned on to activate the X decoder 12. When the chip temperature is equal to or lower than TMP1 (=70° C.), the power-supply control transistors 21c and 22c are turned on regardless of whether the standby signal STB1 indicates the standby state or the active state. In this case, an off-leakage current flows in a transistor that constitutes the X decoder 12. Because the off-leakage current in the temperature region is smaller than the switching current of the power-supply control transistors 21c and 22c, power consumption is reduced more when the power-supply control transistors 21c and 22c are kept turned on.

As described above, the power supply control circuit 16 determines whether the power supply control is performed on the X decoder 12 based on the temperature detection signal TW1 supplied by the temperature detection circuit 18 as well as the standby signal STB1, thereby reducing the power consumption of the X decoder 12.

For the same reason, when the chip temperature exceeds TMP2 (=25° C.), the power supply control is performed on the pre-decoder 13 and the peripheral circuit 14 by the power supply control circuit 17 in response to the standby signal STB2 in the present embodiment. In the case that the chip temperature exceeds TMP2 (=25° C.), when the standby signal STB2 indicates a standby state, the power-supply control transistors 31c and 32c are turned off to reduce the off-leakage current and when the standby signal STB3 indicates an active state, the power-supply control transistors 31c and 32c are turned on to activate the pre-decoder 13 and the peripheral circuit 14. In the case that the chip temperature is equal to or lower than TMP2 (=25° C.), the power-supply control transistors 31c and 32c are turned on regardless whether the standby signal STB2 indicates the standby state or the active state. In this case, an off-leakage current flows in transistors that constitute the pre-decoder 13 and the peripheral circuit 14. Because the off-leakage current in this temperature region is smaller than the switching current of the power-supply control transistors 31c and 32c, power consumption is reduced more when the power-supply control transistors 31c and 32c are kept turned on.

As described above, the power supply control circuit 17 determines whether the power supply control is performed on the pre-decoder 13 and the peripheral circuit 14 based on the temperature detection signal TW2 supplied by the temperature detection circuit 18 as well as the standby signal STB2, thereby reducing the power consumption of the pre-decoder 13 and the peripheral circuit 14.

Figure 7:
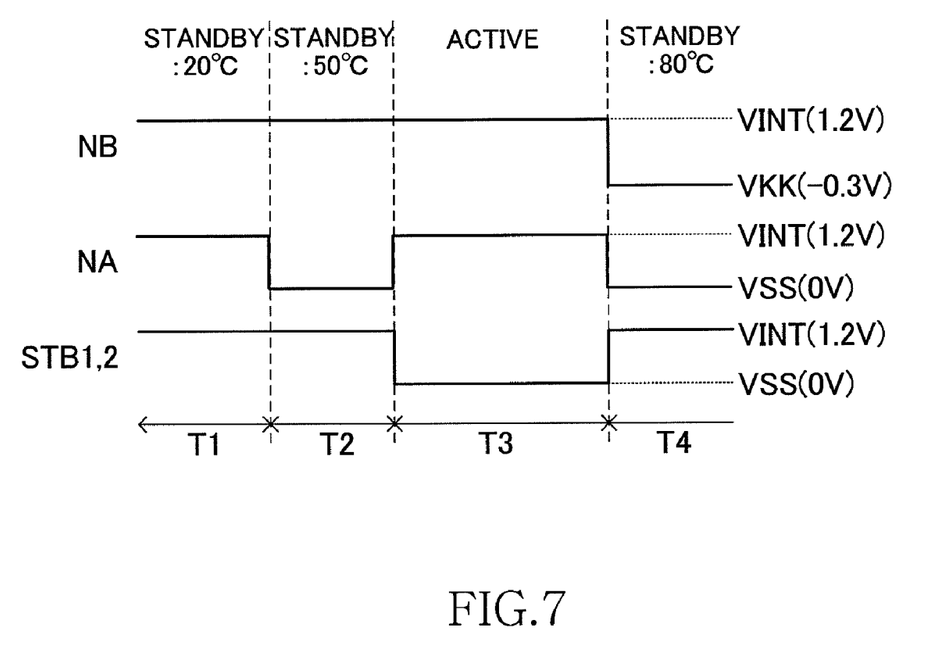
FIG. 7 is a timing diagram showing an example of changes in the power supply control signals NA and NB.

FIG. 7 is a timing diagram showing an example of changes in the power supply control signals NA and NB.

During a time interval T1 shown in FIG. 7, the semiconductor device 10 is in a standby state and the chip temperature is 20° C. In this case, the level of the power supply control signals NA and NB is VINT (1.2 V) and the power-supply control transistors 22c and 32c are turned on. Although the standby signals STB1 and STB2 indicate the standby state, power is still supplied to the X decoder 12, the pre-decoder 13, and the peripheral circuit 14. An off-leakage current is thus generated, but power consumption is reduced as compared to the case that power supply control is performed for the reason described above.

During a time interval T2 shown in FIG. 7, the semiconductor device 10 is in the standby state and the chip temperature is 50° C. In this case, the power supply control signal NA is VSS (0 V) and the power supply control signal NB is VINT (1.2 V). Accordingly, the power-supply control transistor 22c is turned on and the power-supply control transistor 32c is turned off. While power is still supplied to the X decoder 12, the pre-decoder 13 and the peripheral circuit 14 are inactivated.

During a time interval T3 shown in FIG. 7, the semiconductor device 10 is in an active state. In the active state, the level of the power supply control signals NA and NB is VINT (1.2 V) regardless of the chip temperature and the power-supply control transistors 22c and 32c are turned on. With this configuration, the X decoder 12, the pre-decoder 13, and the peripheral circuit 14 are all activated and can be operated correctly depending on input signals.

During a time interval T4 shown in FIG. 7, the semiconductor device 10 is in the standby state and the chip temperature is 80° C. In this case, the level of the power supply control signal NA is VSS (0 V) and the level of the power supply control signal NB is VKK (−0.3 V), so that the power-supply control transistors 22c and 32c are turned off. With this configuration, the logics of the X decoder 12, the pre-decoder 13, and the peripheral circuit 14 are fixed and the off-leakage current is reduced.

As described above, the temperature TMP1 which is a threshold for determining whether power supply control is performed on the X decoder 12 and the temperature TMP2 which is a threshold for determining whether the power supply control is performed on the pre-decoder 13 and the peripheral circuit 14 are set to be different from each other in the present embodiment. The X decoder 12, the pre-decoder 13, and the peripheral circuit 14 can be set to exhibit the lowest power consumption in the respective temperature regions.

While a preferred embodiment of the present invention has been described above, the present invention is not limited thereto. Various modifications can be made without departing from the gist of the present invention and these modifications are of course included in the scope of the present invention.

For example, while the above embodiment has described a case that the power supply control is performed individually on circuit blocks that use two types of transistors with different temperature characteristics of an off-leakage current, the present invention is not limited thereto. Accordingly, the power supply control can be also performed individually on circuit blocks using three or more types of transistors with different temperature characteristics of an off-leakage current. It suffices that the transistors that constitute the circuit blocks have different temperature characteristics of an off-leakage current from each other. Their gate film thicknesses do not need to be different from each other.

An example of three types of transistors with different temperature characteristics of an off-leakage current includes a thick film transistor whose gate film is relatively thick, a first thin film transistor whose gate film is relatively thin and whose threshold voltage is set to be normal, and a second thin film transistor whose gate film is relatively thin and whose threshold voltage is set to be low.

The following circuit blocks are shown as an example of circuit blocks using such transistors. An example of the circuit block using a thick film transistor includes a sense amplifier control circuit in addition to the X-decoder. Examples of the circuit block using a first thin film transistor include a power supply control circuit and a test mode decoder circuit. Examples of the circuit block using a second thin film transistor include, in addition to the pre-decoder 13 and the peripheral circuit 14, a Y decoder, a data read circuit, and a data write circuit. A difference in threshold voltage between the first thin film transistor and the second thin film transistor is adjusted by the amount of ion dose.

While the activation level of the power supply control signal PB is VSS (0 V) and the inactivation level thereof is VPP (2.7 V) in the above embodiment, this is only an example. Therefore, the activation level can be less than VSS and the inactivation level can exceed VPP. As a first modification, when the activation level is set to VKK (−0.3 V) and the inactivation level is set to VPP (2.7 V), an on-current is increased. Therefore, the size of the power-supply control transistor 21c can be further reduced. As a second modification, when the activation level is set to VSS (0 V) and the inactivation level is set to VPP+α (2.9 V), the off-leakage current of the power-supply control transistor 21c can be reduced. As a third modification, when the activation level is set to VKK (−0.3 V) and the inactivation level is set to VPP+α (2.9 V), effects of the first and second modifications can be obtained.

Similarly, while the activation level of the power supply control signal NB is VINT (1.2 V) and the inactivation level thereof is VKK (−0.3 V) in the above embodiment, this is only an example. Therefore, the activation level can exceed VINT and the inactivation level can be less than VKK. For example, as a fourth modification, when the activation level is set to VPP (2.7 V) and the inactivation level is set to VKK (−0.3 V), an on-current is increased. Therefore, the size of the power-supply control transistor 22c can be further reduced. As a fifth modification, when the activation level is set to VINT (1.2 V) and the inactivation level is set to VKK-α (−0.4 V), the off-leakage current of the power-supply control transistor 22c can be reduced. Further, as a sixth modification, when the activation level is set to VPP (2.7 V) and the inactivation level is set to VKK-α (−0.4 V), effects of the fourth and fifth modifications can be obtained.

While a circuit block is activated or inactivated using hierarchical power supply wirings in the above embodiment, using the power supply hierarchization technique is not essential to activate or inactivate the circuit block.

While P-channel MOS transistors are used for the power-supply control transistors 21c and 31c and N-channel MOS transistors are used for the power-supply control transistors 22c and 32c in the above embodiment, the present invention is not limited to this case. Therefore, for example, N-channel MOS transistors can be used for the power-supply control transistors 21c and 31c and driver circuits that a P-channel MOS transistor is connected in parallel to an N-channel MOS transistor can be used. Those skilled in the art could easily understand this based on the basic technical concept of the present application.

While the above embodiment has described a case that the present invention is applied to a semiconductor memory device (semiconductor memory) as an example, the basic technical concept of the present application is not limited to semiconductor memory devices and can be applied to all semiconductor devices. Examples of the semiconductor device include semiconductor devices with active functions such as CPU, MCU, and DSP and semiconductor devices with passive functions. The present invention can be applied to semiconductor devices having memory cells incorporated therein, such as SOC (system on chip), MCP (multi chip package), and POP (package on package). The configuration of a boost voltage generating circuit and a temperature detection circuit and the control method therefore are not particularly limited.

Further, the transistor of the present invention is not limited to a MOS transistor, and can be also applied to various types of FETs (Field Effect Transistors), such as MIS (Metal-Insulator Semiconductor) transistor and TFT (Thin Film Transistor). The transistor can be also a bipolar transistor. In addition, the NMOS transistor (N-channel MOS transistor) and the PMOS transistor (P-channel MOS transistor) are representative examples of a first conductivity-type transistor and a second conductivity-type transistor, respectively.

Furthermore, within the scope of the claims of the present invention, various combinations and selections of disclosed constituent elements can be made. That is, it goes without saying that the present invention includes the entire disclosure of the present application including the claims, as well as various changes and modifications that can be made by those skilled in the art based on the technical concept of the present invention.

What is claimed is:

1. A semiconductor device comprising:
    a first circuit block including a transistor whose off-leakage current has a first temperature characteristic;
    a second circuit block including a transistor whose off-leakage current has a second temperature characteristic different from the first temperature characteristic;
    a first power supply control circuit that inactivates a power supply of the first circuit block when a temperature exceeds a first threshold temperature during a standby state; and
    a second power supply control circuit that inactivates a power supply of the second circuit block when a temperature exceeds a second threshold temperature different from the first threshold temperature during the standby state.

2. The semiconductor device as claimed in claim 1, wherein the transistor having the first temperature characteristic and the transistor having the second temperature characteristic have gate insulating films respectively thickness different from each other.

3. The semiconductor device as claimed in claim 1, wherein the transistor having the first temperature characteristic and the transistor having the second temperature characteristic have threshold voltages respectively different from each other.

4. The semiconductor device as claimed in claim 1, wherein the first and second power supply control circuits activate the power supplies of the first and second circuit blocks respectively regardless of the first and second threshold temperatures in an active state.

5. The semiconductor device as claimed in claim 4, wherein
    the first power supply control circuit activates the power supply of the first circuit block during the standby state and the active state when a temperature does not exceed the first threshold temperature, and the second power supply control circuit activates the power supply of the second circuit block during the standby state and the active state when a temperature does not exceed the second threshold temperature.

6. The semiconductor device as claimed in claim 1, wherein
the first circuit block comprising:
a first main power supply wiring and a second main power supply wiring to which a first supply voltage on a higher potential side and a second supply voltage on a lower potential side are respectively supplied;
a first sub power supply wiring and a second sub power supply wiring that correspond to the first main power supply wiring and the second main power supply wiring, respectively;
a first power-supply control transistor connected between the first main power supply wiring and the first sub power supply wiring;
a second power-supply control transistor connected between the second main power supply wiring and the second sub power supply wiring; and
a first logic circuit connected between the first main power supply wiring or the first sub power supply wiring and the second main power supply wiring or the second sub power supply wiring,
the second circuit block comprising:
a third main power supply wiring and a fourth main power supply wiring to which a third supply voltage on a higher potential side and a fourth supply voltage on a lower potential side are respectively supplied;
a third sub power supply wiring and a fourth sub power supply wiring that correspond to the third main power supply wiring and the fourth main power supply wiring, respectively;
a third power-supply control transistor connected between the third main power supply wiring and the third sub power supply wiring;
a fourth power-supply control transistor connected between the fourth main power supply wiring and the fourth sub power supply wiring; and
a second logic circuit connected between the third main power supply wiring or the third sub power supply wiring and the fourth main power supply wiring or the fourth sub power supply wiring, wherein
the first power supply control circuit inactivates the first and second power-supply control transistors to inactivate the first circuit block, and
the second power supply control circuit inactivates the third and fourth power-supply control transistors to inactivate the second circuit block.

7. The semiconductor device as claimed in claim 6, wherein the first supply voltage is higher than the third supply voltage.

8. The semiconductor device as claimed in claim 7, wherein the first supply voltage is higher than an external voltage on a higher potential side, and the third supply voltage is equal to or lower than the external voltage on the higher potential side.

9. The semiconductor device as claimed in claim 1, wherein
an off-leakage current per unit channel width/channel length ratio of the transistor included in the second circuit block is larger than an off-leakage current per unit channel width/channel length ratio of the transistor included in the first circuit block at a same temperature, and
the second threshold temperature is lower than the first threshold temperature.

10. A semiconductor device comprising:
a first circuit block including a transistor whose off-leakage current has a first temperature characteristic;
a second circuit block including a transistor whose off-leakage current has a second temperature characteristic different from the first temperature characteristic;
a first power supply control circuit that inactivates the first circuit block based on a first standby signal; and
a second power supply control circuit that inactivates the second circuit block based on a second standby signal, wherein
the first power supply control circuit activates the first circuit block regardless of the first standby signal when a temperature does not exceed a first threshold temperature, and
the second power supply control circuit activates the second circuit block regardless of the second standby signal when a temperature does not exceed a second threshold temperature.

11. A semiconductor device comprising:
a first circuit block including a transistor whose off-leakage current has a first temperature characteristic and operates between a first supply voltage on a higher potential side and a second supply voltage on a lower potential side;
a second circuit block including a transistor whose off-leakage current has a second temperature characteristic different from the first temperature characteristic, and operates between a third supply voltage on a higher potential side, which is lower than the first supply voltage, and a fourth supply voltage on a lower potential side;
a first power supply control circuit that inactivates a power supply of the first circuit block when a temperature exceeds a first threshold temperature during a standby state; and
a second power supply control circuit that inactivates a power supply of the second circuit block when a temperature exceeds a second threshold temperature different from the first threshold temperature during the standby state.

12. The semiconductor device as claimed in claim 11, wherein
the first power supply control circuit generates a first control signal that reaches at the first supply voltage, the power supply of the first circuit block being inactivated in response to the first control signal, and
the second power supply control circuit generates a second control signal that reaches at the third supply voltage, the power supply of the second circuit block being inactivated in response to the second control signal.

13. The semiconductor device as claimed in claim 12, wherein the first supply voltage is higher than an external voltage on a higher potential side, and the third supply voltage is equal to or lower than the external voltage on a higher potential side.

14. The semiconductor device as claimed in claim 11, wherein the transistor having the first temperature characteristic includes a gate insulating film having a first thickness and the transistor having the second temperature characteristic includes a gate insulating film having a second thickness thinner than the first thickness.

15. The semiconductor device as claimed in claim 11, wherein a threshold voltage of the transistor having the first temperature characteristic is higher than that of the transistor having a second temperature characteristic.

16. The semiconductor device as claimed in claim 11, wherein the second threshold temperature is lower than the first threshold temperature.

17. The semiconductor device as claimed in claim 15, wherein the first and second power supply control circuits activate the power supplies of the first and second circuit blocks respectively regardless of the first and second threshold temperatures in an active state.

18. The semiconductor device as claimed in claim 17, wherein the first power supply control circuit activates the power supply of the first circuit block during the standby state and the active state when a temperature does not exceed the first threshold temperature, and the second power supply control circuit activates the power supply of the second circuit block during the standby state and the active state when a temperature does not exceed the second threshold temperature.

19. The semiconductor device as claimed in claim 11, wherein an off-leakage current per unit channel width/channel length ratio of the transistor included in the second circuit block is larger than an off-leakage current per unit channel width/channel length ratio of the transistor included in the first circuit block at a same temperature.

20. The semiconductor device as claimed in claim 11, further comprising a memory cell in which information needs to be refreshed by a refresh operation at every predetermined period of time, wherein the refresh operation is performed at least in a self refresh mode, and the first and second power supply control circuits inactivate at least one of the power supplies of the first circuit block and the second circuit block which are not operated during the refresh operation in the self refresh mode.

* * * * *